(12) United States Patent
Kim et al.

(10) Patent No.: US 9,087,750 B2
(45) Date of Patent: Jul. 21, 2015

(54) TOUCH SCREEN SUBSTRATE, METHOD OF MANUFACTURING THE SAME, AND DISPLAY PANEL INCLUDING THE TOUCH SCREEN SUBSTRATE

(75) Inventors: Woong-Kwon Kim, Cheonan-si (KR); Jung-Suk Bang, Guri-si (KR); Sung-Hoon Yang, Seoul (KR); Sang-Youn Han, Seoul (KR); Suk-Won Jung, Goyang-si (KR); Byeong-Hoon Cho, Seoul (KR); Dae-Cheol Kim, Suwon-si (KR); Ki-Hun Jeong, Cheonan-si (KR); Kyung-Sook Jeon, Yongin-si (KR); Seung-Mi Seo, Seoul (KR); Kun-Wook Han, Seongnam-si (KR); Mi-Seon Seo, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 542 days.

(21) Appl. No.: 12/898,839

(22) Filed: Oct. 6, 2010

(65) Prior Publication Data
US 2011/0147746 A1    Jun. 23, 2011

(30) Foreign Application Priority Data

Dec. 23, 2009   (KR) .................... 10-2009-0129383

(51) Int. Cl.
*G06F 3/042* (2006.01)
*H01L 27/12* (2006.01)
*G06F 3/041* (2006.01)

(52) U.S. Cl.
CPC ............ *H01L 27/1251* (2013.01); *G06F 3/042* (2013.01); *G06F 3/0412* (2013.01); *H01L 27/1222* (2013.01); *H01L 27/1233* (2013.01)

(58) Field of Classification Search
CPC ... H01L 27/1214; H01L 27/32; G06G 3/0421
USPC .............. 257/59, 72, E51.005, 225, 233, 414, 257/428, 431, 458, 462; 438/149, 151; 345/175, 182, 173, 179
See application file for complete search history.

(56) References Cited

U.S. PATENT DOCUMENTS 6,365,917 B1 * 4/2002 Yamazaki ...................... 257/72
6,473,072 B1 * 10/2002 Comiskey et al. ............. 345/173

(Continued)

FOREIGN PATENT DOCUMENTS

JP       05-226656 A       9/1993
JP       10-051009 A       2/1998

(Continued)

*Primary Examiner* — Kenneth Parker
*Assistant Examiner* — John Lin
(74) *Attorney, Agent, or Firm* — Cantor Colburn LLP

(57) ABSTRACT

A touch screen substrate includes a base substrate, a first switching element and a first sensing element which senses infrared light. The first switching element includes a first switching gate electrode, a first active pattern disposed on the first switching gate electrode, a first switching source electrode disposed on the first active pattern and a first switching drain electrode disposed apart from the first switching source electrode. The first sensing element includes a first sensing drain electrode connected to the first switching source electrode, a first sensing source electrode disposed apart from the first sensing drain electrode, a second active pattern disposed below the first sensing drain electrode and the first sensing source electrode and including a first amorphous layer, a doped amorphous layer and a second amorphous layer, and a first sensing gate electrode disposed on the first sensing drain electrode and the first sensing source electrode.

10 Claims, 10 Drawing Sheets

(56) References Cited

U.S. PATENT DOCUMENTS

2005/0052435 A1* 3/2005 Cho et al. .............. 345/182
2005/0231656 A1 10/2005 den Boer et al.

FOREIGN PATENT DOCUMENTS

| | | |
|---|---|---|
| JP | 2007-059560 A | 3/2007 |
| KR | 1999-0004360 A | 1/1999 |
| KR | 1020060021005 A | 3/2006 |
| KR | 1020070056828 A | 6/2007 |
| KR | 1020080095739 A | 10/2008 |
| KR | 1020090035431 A | 4/2009 |
| KR | 1020090057892 A | 6/2009 |
| KR | 1020090070286 A | 7/2009 |

* cited by examiner

TOUCH SCREEN SUBSTRATE, METHOD OF MANUFACTURING THE SAME, AND DISPLAY PANEL INCLUDING THE TOUCH SCREEN SUBSTRATE

This application claims priority to Korean Patent Application No. 2009-129383, filed on Dec. 23, 2009, and all the benefits accruing therefrom under 35 U.S.C. §119, the content of which in its entirety is herein incorporated by reference.

BACKGROUND OF THE INVENTION (1) Field of the Invention

Exemplary embodiments of the present invention relate to a touch screen substrate, a method of manufacturing the touch screen substrate and a display panel including the touch screen substrate. More particularly, exemplary embodiments of the present invention relate to a touch screen substrate having substantially enhanced touch sensitivity, a method of manufacturing the touch screen substrate and a display panel including the touch screen substrate.

(2) Description of the Related Art

Generally, a liquid crystal display ("LCD") panel includes a first substrate having a thin-film transistor ("TFT") that drives a pixel, a second substrate facing the first substrate, and a liquid crystal layer interposed between the first and second substrates. To display an image on the LCD, liquid crystals of the liquid crystal layer control light transmittance through the liquid crystal layer by changing an alignment of the liquid crystals according an intensity of an electric field generated in the liquid crystal layer.

The LCD panel may be used as a touch panel operated according to pressure, from a user's touch, for example, that is applied thereto. In this case, the second substrate of the LCD panel may include a photo sensor and a switching element that controls the photo sensor. When pressure is applied to the LCD panel, the photo sensor absorbs incident light having a specific wavelength to generate a photo current. A central process unit connected to the LCD panel calculates a touch position based on a difference between the photo current and a dark current generated by the photo sensor before the incident light is irradiated onto the photo sensor.

Generally, electrical characteristics of the photo sensor are different from electrical characteristics of the switching element. Specifically, the switching element is merely turned on or off by a gate signal, while the photo sensor generates the photo current, having multiple values, based on the incident light. As a result, an enhancement of the sensitivity of the photo sensor for detecting the incident light is desired. Accordingly, various semiconductor materials have been developed in efforts to enhance the sensitivity of the photo sensor. However, maximizing and/or improving productivity of the liquid crystal display panel is limited, due to high costs for research and development of the various semiconductor materials.

BRIEF SUMMARY OF THE INVENTION

Example embodiments of the present invention provide a touch screen substrate having substantially enhanced touch sensitivity.

Example embodiments of the present invention also provide a method of manufacturing the touch screen substrate.

Example embodiments of the present invention also provide a display panel including the touch screen substrate.

In an exemplary embodiment, a touch screen substrate includes a base substrate, a first switching element disposed on the base substrate and a first sensing element disposed on the base substrate and which senses infrared light. The first switching element includes a first switching gate electrode, a first active pattern disposed on the first switching gate electrode, a first switching source electrode disposed on the first active pattern and a first switching drain electrode disposed apart from the first switching source electrode. The first sensing element includes a first sensing drain electrode connected to the first switching source electrode, a first sensing source electrode disposed apart from the first sensing drain electrode, a second active pattern disposed below the first sensing drain electrode and the first sensing source electrode and including a first amorphous layer, a doped amorphous layer and a second amorphous layer, and a first sensing gate electrode disposed on the first sensing drain electrode and the first sensing source electrode.

In an exemplary embodiment, the first amorphous layer and the second amorphous layer include amorphous silicon germanium or amorphous germanium.

In an exemplary embodiment, the doped amorphous layer includes amorphous silicon germanium (doped with phosphorus, arsenic or antimony), or amorphous germanium (doped with phosphorus, arsenic or antimony).

In an exemplary embodiment, the first active pattern includes a silicon layer including amorphous silicon, and an ohmic contact layer disposed on the silicon layer and doped with n-type impurities.

In an exemplary embodiment, a thickness of the doped amorphous layer is greater than zero angstroms and not greater than 100 angstroms.

In an exemplary embodiment, the touch screen substrate may further include a light blocking pattern disposed below the first sensing element and connected to the first sensing gate electrode.

In an exemplary embodiment, the touch screen substrate may further include a first sensing gate line connected to the first switching gate electrode, a bias line connected to the first sensing source electrode, a first read-out line connected to the first switching drain electrode and which transmits an infrared sensing signal generated from the first sensing element and a second sensing gate line connected to the first sensing gate electrode.

In an exemplary embodiment, the touch screen substrate may further include a second sensing element which senses a visible light and a second switching element. The second sensing element may include a second sensing source electrode connected to the bias line, a second sensing drain electrode disposed apart from the second sensing source electrode, a third active pattern overlapping the second sensing source electrode and the second sensing drain electrode, and a second sensing gate electrode connected to the second sensing gate line. The second switching element may include a second switching source electrode connected to the second sensing drain electrode, a second switching drain electrode disposed apart from the second switching source electrode, a fourth active pattern overlapping the second switching source electrode and the second switching drain electrode, and a switching gate electrode overlapping the fourth active pattern.

In an exemplary embodiment, the touch screen substrate may further include a third sensing gate line connected to the second switching gate electrode and a second read-out line connected to the second switching drain electrode and which transmits a visible light sensing signal generated from the second sensing element.

In an exemplary embodiment, a method of manufacturing the touch screen substrate is provided. The method of manufacturing the touch screen substrate includes forming a first sensing gate line and a first switching gate electrode connected to the first sensing gate line on a base substrate, forming a first active pattern overlapping the first switching gate electrode, forming a second active pattern including a first amorphous layer, a doped amorphous layer and a second amorphous layer on the base substrate including the first active pattern formed thereon, forming a first switching source electrode and a first switching drain electrode disposed apart from the first switching source electrode on the first active pattern formed on the base substrate, forming a first sensing source electrode and a first sensing drain electrode disposed apart from the first sensing source electrode on the second active pattern formed on the base substrate, and forming a bias line and a first sensing gate electrode on the base substrate including the first sensing source and drain electrodes formed thereon.

In an exemplary embodiment, the forming the second active pattern may include forming the first amorphous layer on the base substrate including the first active pattern formed thereon, forming the doped amorphous layer by providing an amorphous semiconductor and impurities on the first amorphous layer formed on the base substrate, forming the second amorphous layer by providing the amorphous semiconductor on the doped amorphous layer formed on the base substrate, and patterning the first amorphous layer, the doped amorphous layer and the second amorphous layer.

In an exemplary embodiment, a concentration of the impurities may be greater than about zero atomic percent and not greater than about 5 atomic percent with respect to a total number of atoms of the doped amorphous layer.

In an exemplary embodiment, the method of manufacturing the touch screen substrate may further include forming a light blocking pattern on the base substrate, where the light blocking pattern overlaps the second active pattern.

In an exemplary embodiment, the method of manufacturing the touch screen substrate may further include forming an insulating layer between the light blocking pattern and the first sensing gate electrode, and removing a portion of the insulating layer overlapping the light blocking pattern, where the removed portion of the insulating layer exposes a portion of the light blocking member, and the first sensing gate electrode is connected to the exposed portion of the light blocking pattern.

In an exemplary embodiment, the method of manufacturing the touch screen substrate may further include forming a first read-out line connected to the first switching drain electrode, forming a second sensing source electrode, forming a drain electrode disposed apart from the second sensing source electrode, forming a second switching source electrode connected to the second sensing drain electrode, forming a second switching drain electrode disposed apart from the second switching source electrode, forming a second read-out line connected to the second switching drain electrode, and forming a second sensing gate line connected to the first and second sensing source electrodes.

In an exemplary embodiment, the method of manufacturing the touch screen substrate may further include forming a second switching gate electrode overlapping the second switching source electrode and the second switching drain electrode, and forming a third sensing gate line connected to the second switching gate electrode.

In an exemplary embodiment, the method of manufacturing the touch screen substrate may further include forming a third active pattern overlapping the second switching gate electrode, and forming a fourth active pattern overlapping the second sensing gate electrode.

In an exemplary embodiment, the forming the first active pattern may include forming a semiconductor layer on the first switching gate electrode formed on the base substrate, forming an ohmic contact layer doped with a high concentration of n-type impurities on the semiconductor layer formed on the base substrate, and patterning the semiconductor layer and the ohmic contact layer.

In another exemplary embodiment, a display panel includes an array substrate including a pixel electrode and a pixel switching element connected to the pixel electrode; and a touch screen substrate disposed opposite the array substrate and including a switching element and a sensing element which senses infrared light. The switching element includes a switching gate electrode a first active pattern disposed on the switching gate electrode, a switching source electrode disposed on the first active pattern, and a switching drain electrode disposed apart from the switching source electrode, and the sensing element includes a sensing drain electrode connected to the switching source electrode; a sensing source electrode disposed apart from the sensing drain electrode, a second active pattern disposed below the sensing drain electrode and the sensing source electrode and including a first amorphous layer, a doped amorphous layer and a second amorphous layer, and a sensing gate electrode disposed on the sensing drain electrode and the sensing source electrode.

In an exemplary embodiment, the first sensing element includes the second active pattern including the doped amorphous layer disposed between the first and second amorphous layers and which has a lower energy level than energy levels of the first and second amorphous layers such that the second active pattern includes an electron well formed by the doped amorphous layer. Thus, a sensitivity of the first sensing element to the infrared light is substantially enhanced.

BRIEF DESCRIPTION OF THE DRAWINGS

The above and other features and advantages of the present invention will become more readily apparent by describing in further detail example embodiments thereof with reference to the accompanying drawings, in which.

DETAILED DESCRIPTION OF THE INVENTION

Figure 1:
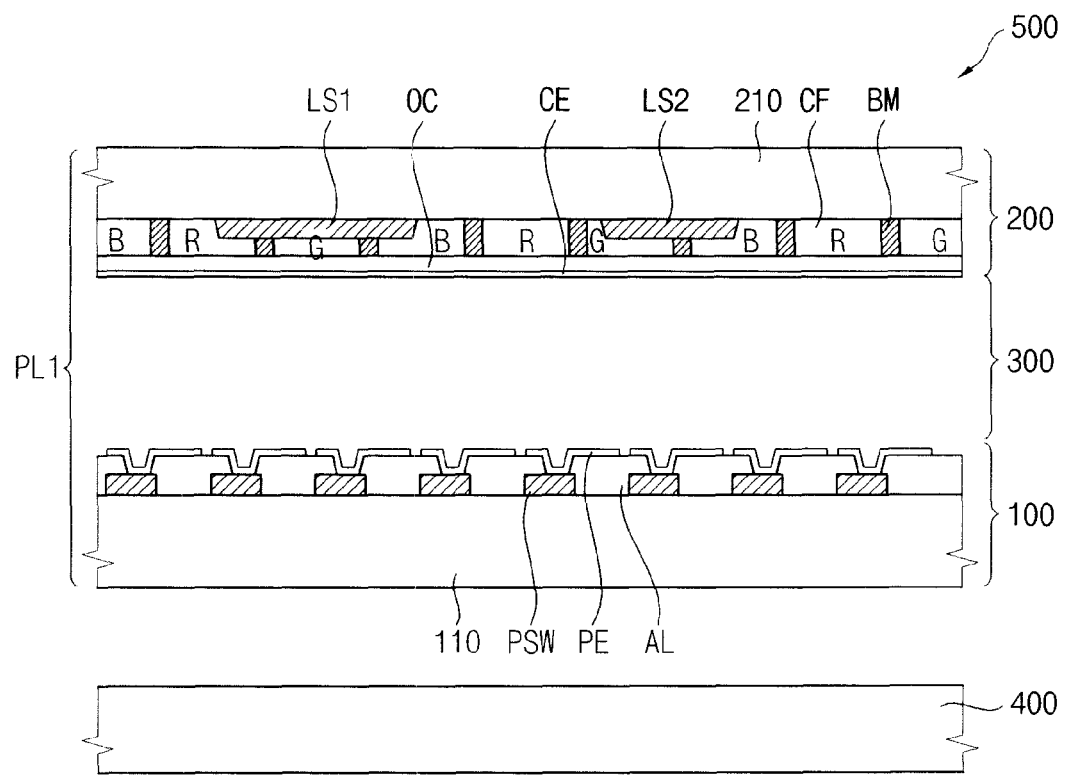
FIG. 1 is a partial cross-sectional view of an exemplary embodiment of a display panel according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a partial cross-sectional view of an exemplary embodiment of a display panel according to the present invention.

Referring to FIG. 1, the display device 500 includes a display panel PL1 and a backlight assembly 400 that provides light to the display panel PL1. The display panel PL1 includes an array substrate 100, a touch screen substrate 200 and a liquid crystal layer 300. The display device 500 senses a position of an object that contacts the display panel PL1. In an exemplary embodiment, the display device 500 may scan an image proximate to the display panel PL1. The backlight assembly 400 is disposed below the array substrate 100.

The array substrate 100 includes a first base substrate 110, a pixel switching element PSW disposed on the first base substrate 110, a pixel electrode PE connected to the pixel switching element PSW and an array layer AL. In an exemplary embodiment, the pixel electrode PE may define a pixel unit of the array substrate 100.

The touch screen substrate 200 is disposed opposite to, e.g., facing, the array substrate 100, and the liquid crystal layer 300 is interposed between the array substrate 100 and the touch screen substrate 200. The touch screen substrate 200 includes a second base substrate 210, a first photo sensor LS1 and a second photo sensor LS2. The touch screen substrate 200 may further include a black matrix BM, a color filter CF, an overcoating layer OC and a common electrode CE. The common electrode CE is disposed opposite to, e.g., facing, the pixel electrode and thereby generates an electric filed in the liquid crystal layer 300. Each of the first photo sensor LS1 and the second photo sensor LS2 may be disposed in a region corresponding to three pixel units of the array substrate 100. The first photo sensor LS1 senses an infrared light and the second photo sensor LS2 senses a visible light.

In an exemplary embodiment, the backlight assembly 400 is disposed below the array substrate 100. The backlight assembly 400 includes an infrared ("IR") light source that provides the infrared light to the display panel PL1, and a visible light source that provides the visible light to the display panel PL1. Each of the infrared light source and the visible light source may include a light emitting diode ("LED.")

Hereinafter, an exemplary embodiment of the array substrate 100 will be described in greater detail with reference to FIG. 2, and the touch screen substrate 200 will be described in greater detail with reference to FIGS. 3, 4A and 4B.

Figure 2:
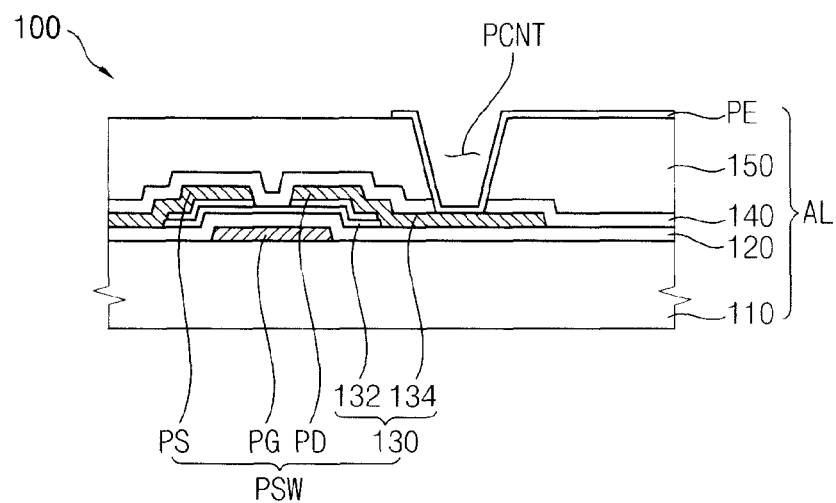
FIG. 2 is an enlarged partial cross-sectional view of an array substrate of the display panel shown in FIG. 1.

FIG. 2 is an enlarged partial cross-sectional view of an array substrate of the display panel shown in FIG. 1.

Referring to FIG. 2, the pixel switching element PSW includes a pixel gate electrode PG, a pixel semiconductor pattern 130, a pixel source electrode PS and a pixel drain electrode PD. The array layer AL includes a gate insulating layer 120 disposed on the pixel gate electrode PG and a passivation layer 140 disposed on the pixel source electrode PS and the pixel drain electrode PD. The array layer AL may further include an organic layer 150 disposed on the passivation layer 140. The pixel drain electrode PD is connected to the pixel electrode PE through a pixel contact hole PCNT, and the pixel contact hole PCNT is formed through the passivation layer 140 and the organic layer 150.

The pixel semiconductor pattern 130 includes a silicon layer 132 and a doped silicon layer 134. The silicon layer 132 includes amorphous silicon ("a-Si.") The doped silicon layer 134 includes amorphous silicon doped with a high concentration of n-type impurities ("n+ a-Si.")

Figure 3:
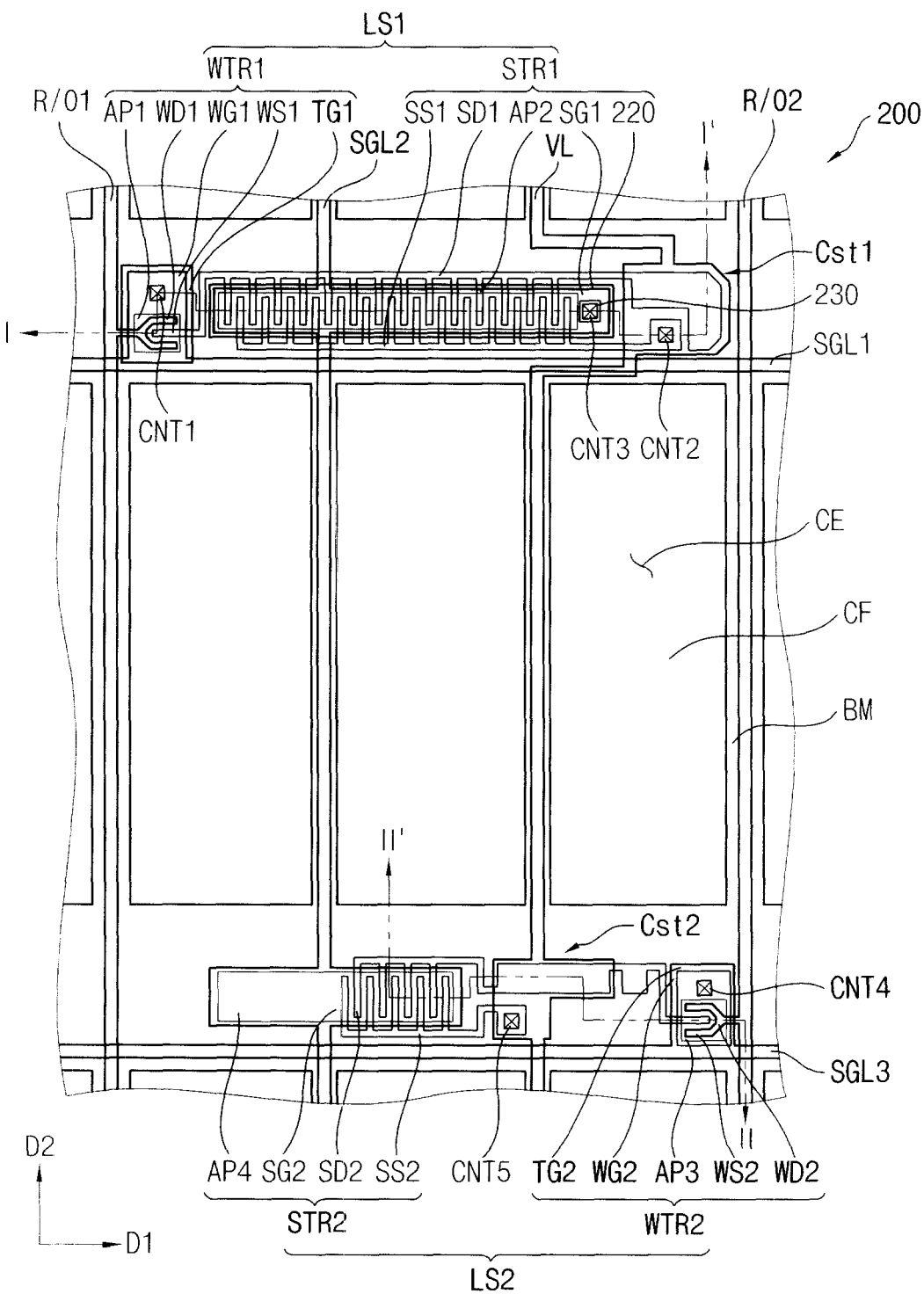
FIG. 3 is a plan view of a touch screen substrate of the display panel shown in FIG. 1.

FIG. 3 is a plan view of a touch screen substrate of the display panel shown in FIG. 1.

Referring to FIG. 3, the touch screen substrate 200 includes the first photo sensor LS1 including a first switching element WTR1 and a first sensing element STR1, a first sensing gate line SGL1, a second sensing gate line SGL2, a bias line VL, a first read-out line R/O1, a light blocking pattern 220 and a first capacitor Cst1.

In an exemplary embodiment, the first sensing gate line SGL1 extends in a first direction D1 and transmits a first sensing gate signal. The second sensing gate line SGL2 extends in a second direction D2 and thereby crosses the first sensing gate line SGL1, and transmits a second sensing gate signal. In an exemplary embodiment, the first direction D1 may be substantially perpendicular to the second direction D2.

The bias line VL extends in the second direction D2 and applies a source bias. The bias line VL is disposed adjacent to the second sensing gate line SGL2 in the first direction D1.

The first read-out line R/O1 extends in the second direction D2. The first read-out line R/O1 is disposed adjacent to the second sensing gate line SGL2 such that the second sensing gate line SGL2 is disposed between the first read-out line R/O1 and the bias line VL. An infrared sensing signal generated by the first sensing element STR1 is transmitted to a central process unit connected to the display panel PL1.

The first switching element WTR1 is connected to the first sensing gate line SGL1 and the first read-out line R/O1. The first switching element WTR1 includes a first switching gate electrode WS1, a first switching source electrode WS1, a first switching drain electrode WD1 and a first active pattern AP1. The first switching gate electrode WG1 is connected to the first sensing gate line SGL1. The first switching drain electrode WD1 is connected to the first read-out line R/O1. The first switching source electrode WS1 is disposed apart from the first switching drain electrode WD1. The first active pattern AP1 overlaps the first switching gate electrode WG1, the first switching source electrode WS1 and the first switching drain electrode WD1.

The first switching element WTR1 may further include a first top gate electrode TG1. The first top gate electrode TG1 is disposed opposite to, e.g., facing, the first switching gate electrode WG1. The first switching source electrode WS1, the first switching drain electrode WD1 and the first active pattern AP1 are disposed between the first top gate electrode TG1 and the first switching gate electrode WG1. The first top gate electrode TG1 may be connected to the switching gate electrode WG1 through a first contact hole CNT1. Thus, the first switching element WTR1 may have a double gate structure including the first top gate electrode TG1 and the first switching gate electrode WG1.

The first sensing element STR1 senses an infrared light irradiated from the backlight assembly 400. The first sensing element STR1 is connected to the second sensing gate line SGL2, the bias line VL and the first switching element WTR1. The first sensing element STR1 includes a first sensing gate electrode SG1, a first sensing source electrode SS1, a first sensing drain electrode SD1 and a second active pattern AP2. The sensing gate electrode SG1 is connected to the second sensing gate line SGL2. The first sensing source electrode SS1 is connected to the bias line VL through a second contact hole CNT2. The first sensing drain electrode SD1 is disposed apart from the first sensing source electrode SS1 and connected to the first switching source electrode WS1. Each of the first sensing drain electrode SD1 and the first sensing source electrode SS1 may have a pectinate structure including repeated U-shaped portions to increase a channel region. The second active pattern AP2 overlaps the first sensing gate electrode SG1, the first sensing source electrode SS1 and the first sensing drain electrode SD1. The second active pattern AP2 will be described in greater detail with reference to FIGS. 4A, 6A and 6B.

In an exemplary embodiment, the light blocking pattern 220 is disposed below the first sensing element STR1. The light blocking pattern 220 may include a semiconductor material. In an exemplary embodiment, the light blocking pattern 220 may include amorphous silicon germanium ("a-SiGe.") The light blocking pattern 220 allows the infrared light to pass through and blocks the visible light by absorbing the visible light. When an object makes contact with the second base substrate 210, the infrared light that has passed through the light blocking pattern 220 is reflected by the object, the reflected infrared light passes through the light blocking pattern 220, and then the transmitted infrared light is irradiated to the first sensing element STR1. However, the visible light is blocked by the light blocking pattern 220 so that the visible light does not pass through the second base substrate 210. The light blocking pattern 220 may be connected to the first sensing gate electrode SG1 through a third contact hole CNT3. The second sensing gate signal of the second sensing gate line SGL2 is applied to the first sensing gate electrode SG1 and the light blocking pattern 220. In an exemplary embodiment, the first sensing element STR1 may be have a double gate structure including the light blocking pattern 220 and the first sensing gate electrode SG1. In an alternative exemplary embodiment, the light blocking pattern 220 may be connected to an additional signal line to apply the sensing gate signal.

Figure 4A:
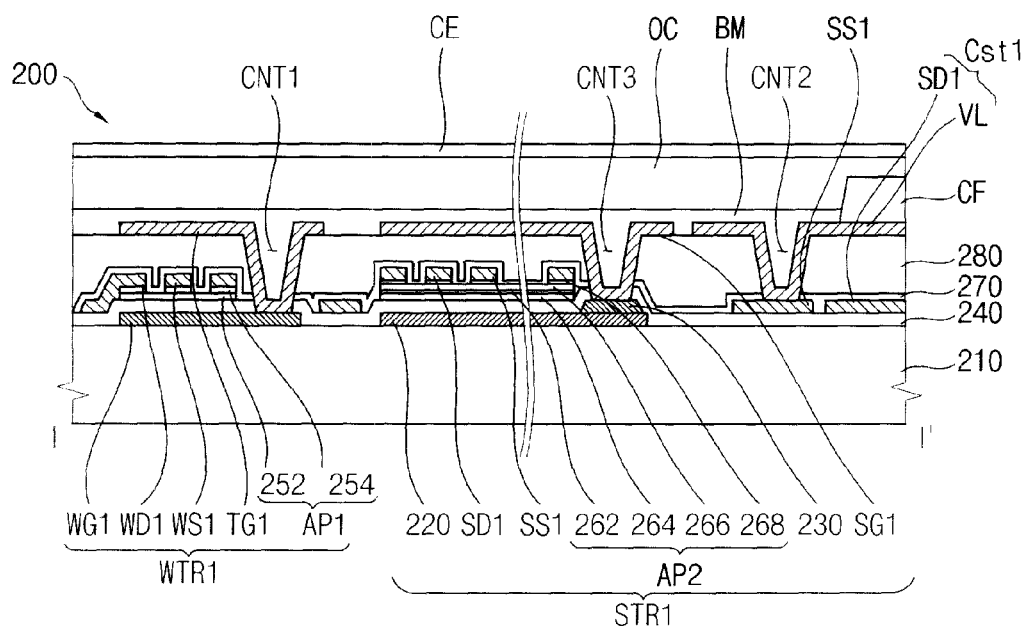
FIG. 4A is a partial cross-sectional view taken along line I-I' of FIG. 3.

The first capacitor Cst1 may be formed by the first sensing drain electrode SD1 that is a first electrode of the first capacitor Cst1, the bias line VL that is a second electrode of the first capacitor Cst1 facing the first electrode, and a dielectric layer disposed between the first electrode and the second electrode and including a second insulating layer 270 (shown in FIG. 4A) and a third insulating layer 280 (shown in FIG. 4A).

A process of sensing the infrared light via the first switching element WTR1 and the first sensing element STR1 will now be described in greater detail.

When the second sensing gate line SGL2 receives the second sensing gate signal, the sensing source electrode SS1 receives the source bias through the bias line VL in response to the second sensing gate signal. The second sensing gate signal is a gate bias having a negative voltage level.

When the second sensing gate signal is applied to the second sensing gate line SGL2 and the infrared light is irradiated to the second active pattern AP2, the first sensing source electrode SS1 and the first sensing drain electrode SD1 are electrically connected to each other. Accordingly, the second active pattern AP2 is activated, and a photo current is thereby generated between the first sensing source electrode SS1 and the first sensing drain electrode SD1.

The photo current is outputted to the first read-out line R/O1 through the first switching element WTR1 that is turned on in response to the first sensing gate signal. The central process unit receives the outputted photo current signal to calculate the touched position of the touch screen substrate 200 based on the outputted photo current signal.

The touch screen substrate 200 may further include a third sensing gate line SGL3, a second read-out line R/O2, a second switching element WTR2, a second sensing element STR2 and a second capacitor Cst2.

The third sensing gate line SGL3 extends in the first direction D1. The third sensing gate line SGL3 is disposed substantially parallel to the first sensing gate line SGL1.

The second read-out line R/O2 extends in the second direction D2. The second read-out line R/O2 is disposed adjacent to the bias line VL. The second sensing gate line SGL2 and the bias line VL may be disposed between the first read-out line R/O1 and the second read-out line R/O2.

The second switching element WTR2 includes a second switching gate electrode WG2, a second switching source electrode WS2, a second switching drain electrode WD2 and a third active pattern AP3. The second switching gate electrode WG2 is connected to the third sensing gate line SGL3. The second switching drain electrode WD2 is connected to the second read-out line R/O2. The switching source electrode WS2 is disposed apart from the second switching drain electrode WD2. The third active pattern AP3 overlaps the second switching gate electrode WG2.

The second switching element WTR2 may further include a second top gate electrode TG2. The second top gate electrode TG2 is disposed opposite to, e.g., facing, the second switching gate electrode WG2. The second switching source and drain electrodes WS2 and WD2 are disposed between the second top gate electrode TG2 and the second switching gate electrode WG2. The second top gate electrode TG2 may be connected to the second switching gate electrode WG2 through a fourth contact hole CNT4. In an exemplary embodiment, the second switching element WTR2 may have a double gate structure including the second top gate electrode TG2 and the second switching gate electrode WG2.

The second sensing element STR2 senses the visible light provided from the backlight assembly 400. The second sensing element STR2 is connected to the second sensing gate line SGL2, the bias line VL and the second switching element WTR2. The second sensing element STR2 includes a sensing gate electrode SG2, a second sensing source electrode SS2, a second sensing drain electrode SD2 and a fourth active pattern AP4. The second sensing gate electrode SG2 is connected to the second sensing gate line SGL2. The second sensing source electrode SS2 is connected to the bias line VL through a fifth contact hole CNT5. The second sensing drain electrode SD2 is disposed apart from the second sensing source electrode SS2 and connected to the second switching source electrode WS2. Each of the second sensing drain electrode SD2 and the second sensing source electrode SS2 may have a pectinate structure including repeated U-shaped portions to increase a channel region of the second sensing element STR2. The fourth active pattern AP4 may overlap the second sensing gate electrode SG2, the second sensing source electrode SS2 and the second sensing drain electrode SD2.

The second capacitor Cst2 is formed by the second sensing drain electrode SD2 as a first electrode of the second capacitor Cst2, the bias line VL facing the first electrode as a second electrode of the second capacitor Cst2, and a dielectric layer disposed between the first electrode and the second electrode and including the second insulating layer 270 and the third insulating layer 280.

FIG. 4A is a partial cross-sectional view taken along line I-I' of FIG. 3. FIG. 4B is a partial cross-sectional view taken along line II-IF of FIG. 3.

Figure 4B:
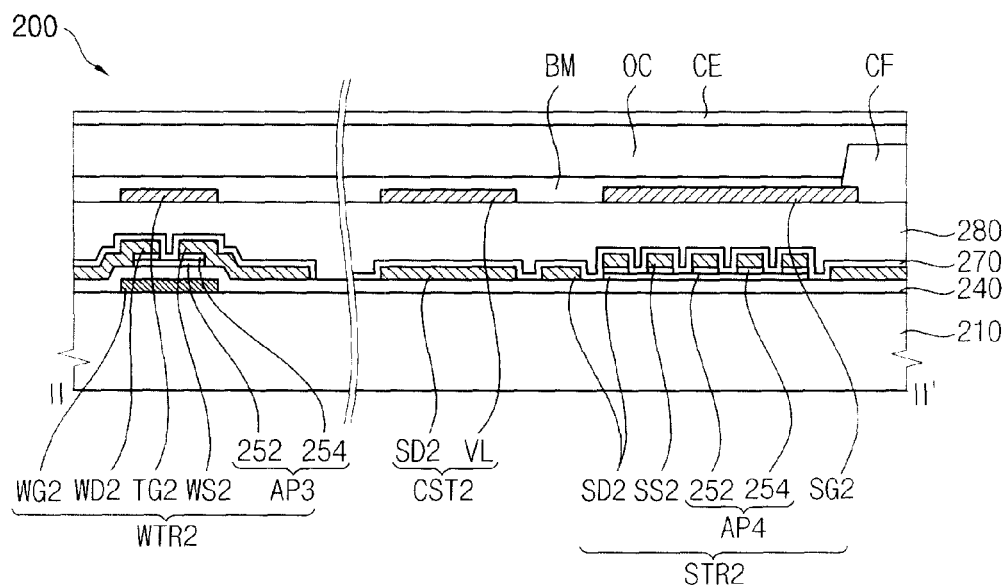
FIG. 4B is a partial cross-sectional view taken along line II-IF of FIG. 3.

Referring to FIGS. 4A and 4B, the touch screen substrate 200 may further include a first insulating layer 240 disposed on the second base substrate 210, a contact electrode 230, the second insulating layer 270 and the third insulating layer 280.

The first insulating layer 240 is disposed on the second base substrate 210 including the first and second switching gate electrodes WG1 and WG2, the contact electrode 230 and the light blocking pattern 220.

The contact electrode 230 is disposed on the light blocking pattern 220 and is exposed by the third contact hole CNT3. The contact electrode 230 protects the light blocking pattern 220 in a process of forming the third contact hole CNT3. The light blocking pattern 220 and the first sensing gate electrode SG1 are connected to each other through the contact electrode 230.

The first active pattern AP1 includes a semiconductor layer 252 and a first ohmic contact layer 254. The semiconductor layer 252 includes amorphous silicon ("a-Si"), and the first ohmic contact layer 254 includes amorphous silicon doped with a high concentration of n-type impurities ("n+ a-Si"). In an alternative exemplary embodiment, the semiconductor layer 252 may include amorphous silicon germanium ("a-SiGe"), and the first ohmic contact layer 254 may include amorphous silicon germanium doped with a high concentration of n-type impurities ("n+ a-SiGe"). An amount of silicon atom and germanium atom in the semiconductor layer 252 is different from an amount of silicon atom and germanium atom in the light blocking pattern 220.

The second active pattern AP2 includes a first amorphous layer 262, a doped amorphous layer 264 and a second amorphous layer 266. The second active pattern AP2 will be described later in greater detail with reference to FIG. 5.

Each of the third active pattern AP3 and the fourth active pattern AP4 includes the semiconductor layer 252 and the first ohmic contact layer 254. The third active pattern AP3 and the fourth active pattern AP4 are substantially the same as the first active pattern AP1, except for the position on the second base substrate 210 at which the third and fourth active patterns AP3 and AP4 are disposed. Thus, any repetitive description thereof will hereinafter be omitted or simplified.

The second insulating layer 270 is disposed on the second base substrate 210, the first switching source and drain electrodes WS1 and WD1, the first sensing source and drain electrodes SS1 and SD1, the second switching source and drain electrodes WS2 and WD2 and the second sensing source and drain electrodes SS2 and SD2 are disposed on the second base substrate 210.

The first and second top gate electrodes TG1 and TG2, the first and second switching gate electrodes WG1 and WG2 and the first and second sensing gate electrodes SG1 and SG2 are disposed on the third insulating layer 280. In an alternative exemplary embodiment, the third insulating layer 280 may be omitted.

The black matrix BM is disposed above the first and second switching elements WTR1 and WTR2, the first and second sensing elements STR1 and STR2, the first and second readout lines R/O1 and R/O2, the first, second and third sensing gate lines SGL1, SGL2 and SGL3 and the bias line VL.

The color filter CF is disposed in a region where the black matrix BM is not formed. In an exemplary embodiment, the color filter CF may be disposed in the region opposite to e.g., facing, the pixel electrode PE of the array substrate 100.

The touch screen substrate 200 may further include the overcoating layer OC. The overcoating layer OC is formed on the second base substrate 210 having the black matrix BM and the color filter CF formed on the second base substrate 210.

The common electrode CE is disposed on the overcoating layer OC. In an exemplary embodiment, the common electrode CE may be disposed on the overcoating layer OC covering the touch screen substrate 200.

Hereinafter, the second active pattern AP2 will be described in greater detail referring to FIGS. 5, 6A and 6B.

Figure 5:
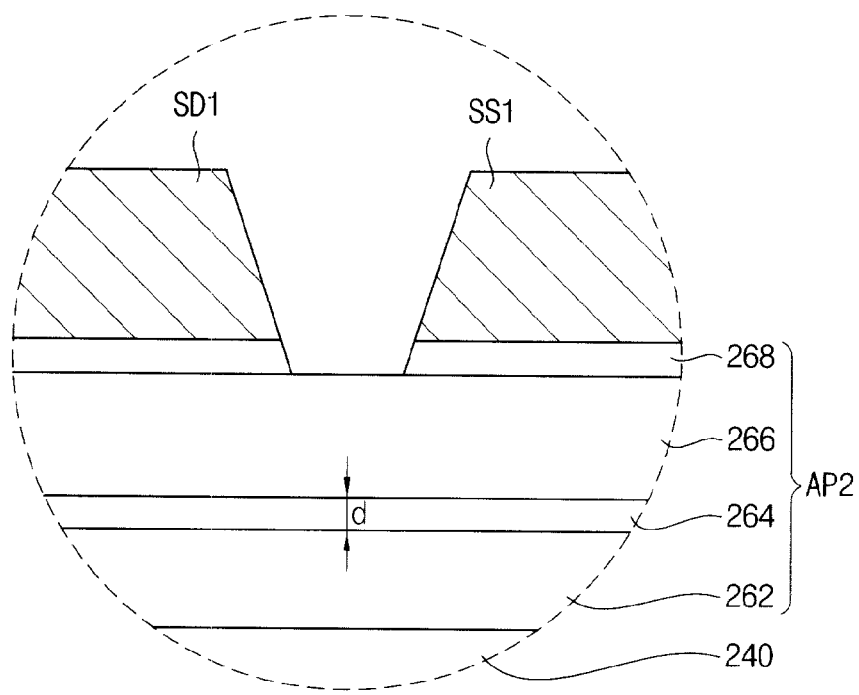
FIG. 5 is an enlarged partial cross-sectional view of an active pattern of a first sensing element of the touch screen substrate shown in FIG. 4A.

FIG. 5 is an enlarged partial cross-sectional view of an active pattern of a first sensing element of the touch screen substrate shown in FIG. 4A.

Referring to FIGS. 4A and 5, the second active pattern AP2 includes the first amorphous layer 262, the doped amorphous layer 264 and the second amorphous layer 266. The second active pattern AP2 may further include a second ohmic contact layer 268 disposed on the second amorphous layer 266. In the second active pattern AP2, Electrons thereof are excited by the infrared light, and the photo current is thereby generated.

The first amorphous layer 262 is disposed on the first insulating layer 240. The first amorphous layer 262 may include amorphous silicon germanium ("a-SiGe") or amorphous germanium ("a-Ge.") A thickness of the first amorphous layer 262 may be in a range from about 2,500 angstroms (Å) to about 3,500 Å.

The doped amorphous layer 264 is disposed on the first amorphous layer 262. The doped amorphous layer 264 may include amorphous silicon germanium doped with a low concentration of n-type impurities or amorphous germanium doped with a low concentration of n-type impurities. The n-type impurities may include a group V element. In an exemplary embodiment, the n-type impurities may include phosphorus (P), arsenic (As), antimony (Sb), for example. The concentration of n-type impurities may be greater than about zero (0) atomic percent ("at. %") and not greater than about 5 at. % with respect to the total number of atoms of the doped amorphous layer 264. The thickness of the doped amorphous layer 264 may be greater than about 0 Å and not greater than about 100 Å.

The second amorphous layer 266 is disposed on the doped amorphous layer 264. The second amorphous layer 266 is substantially the same as the first amorphous layer 262 except that the second amorphous layer 266 is disposed on the doped amorphous layer 264. Thus, any further repetitive description thereof will hereinafter be omitted or simplified.

The second ohmic contact layer 268 is disposed on the second amorphous layer 266 and exposes a portion of the second amorphous layer 266. The second ohmic contact layer 268 may include amorphous silicon germanium doped with a low concentration of n-type impurities or amorphous germanium doped with a high concentration of n-type impurities. The concentration of the impurities included the second ohmic contact layer 268 is about 5 times to about 50 times higher than the concentration of the impurities included in the doped amorphous layer 264.

Hereinafter, the second active pattern AP2 of the first sensing element STR1 will be described in greater detail with reference to FIGS. 6A and 6B. As shown in FIGS. 6A and 6B, a first barrier of a junction between the first amorphous layer 262 and the first insulating layer 240 is referred to as "A," and a second barrier of a junction between the second amorphous layer 266 and the second insulating layer 270 is referred to as "B". A distance between "A" and "B" is substantially the same as the total thickness of the first amorphous layer 262, the doped amorphous layer 264 and the second amorphous layer 266. A longitudinal direction of each of "A" and "B" indicates an energy potential.

Figure 6A:
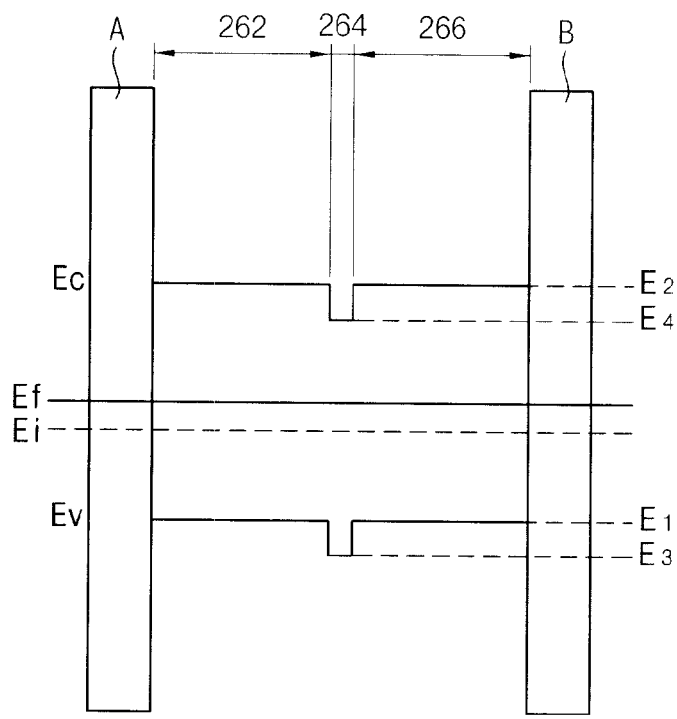
FIG. 6A is an energy band diagram of the active pattern shown in FIG. 5 before a gate signal is applied to a first sensing element thereof.

FIG. 6A is an energy band diagram of the active pattern shown in FIG. 5 before a gate signal is applied to a first sensing element thereof.

Referring to FIG. 6A, the amorphous silicon germanium of the first and second amorphous layers 262 and 266, respectively, has a first energy level $E_1$ in a valence band Ev. The amorphous silicon germanium of the first and second amorphous layers 262 and 266 has a second energy level $E_2$ in a conductive band Ec. The amorphous silicon germanium of the first and second amorphous layers 262 and 266, respectively, has a Fermi energy level $E_f$ in a forbidden band between the first energy level $E_1$ and the second energy level $E_2$.

In an exemplary embodiment, when the doped amorphous layer 264 includes amorphous silicon germanium doped with a group V element, the doped amorphous layer 264 has a third energy level $E_3$ lower than the first energy level $E_1$. In addition, the doped amorphous layer 264 has a fourth energy level $E_4$ lower than the second energy lever $E_2$ in the conductive band Ec. Therefore, the second active pattern AP2 has an energy band similar to an electric potential energy well defined by an electron potential barrier between the first amorphous layer 262 and the doped amorphous layer 264, and an electron potential barrier between the second amorphous layer 266 and the doped amorphous layer 264. Accordingly, the doped amorphous layer 264 may function as an electron well layer. When the light is not incident to the second active pattern AP2, a dark current is not generated by the doped amorphous layer 264 although the doped amorphous layer 264 is disposed between the first and second amorphous layers 262 and 266 because the doped amorphous layer 264 has a substantially thin nano-scale thickness and the concentration of the impurities of the doped amorphous layer 264 is substantially low.

In an exemplary embodiment, a difference between the first and second energy levels $E_1$ and $E_2$ may be substantially the same as the difference between the third and fourth energy levels $E_3$ and $E_4$ so that all of the first and second amorphous layers 262 and 266 and the doped amorphous layer 264 may absorb the infrared light having substantially the same wavelength when the infrared light is irradiated to the first sensing element STR1.

Figure 6B:
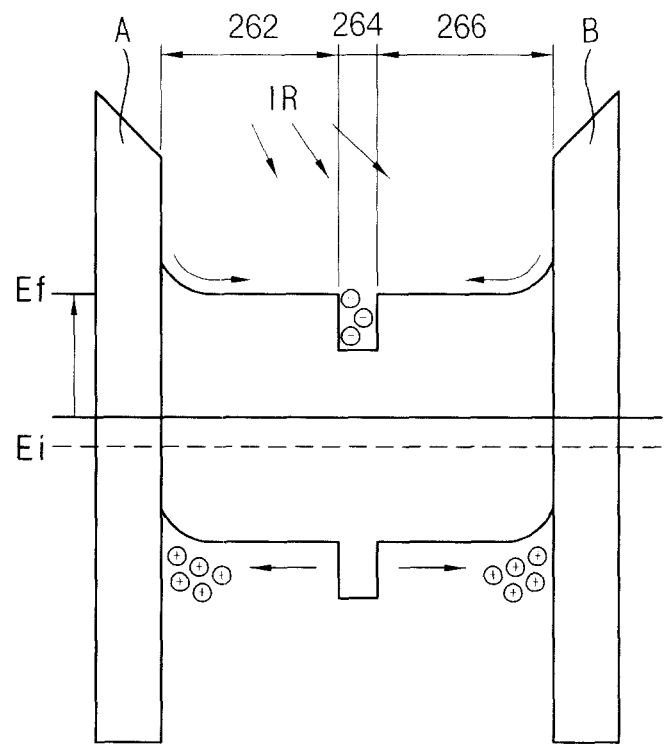
FIG. 6B is an energy band diagram of the active pattern shown in FIG. 5 after a gate signal is applied to the first sensing element.

FIG. 6B is an energy band diagram of the active pattern shown in FIG. 5 after a gate signal is applied to the first sensing element.

Referring to FIG. 6B, when a second sensing signal having a negative voltage level is applied to the first sensing gate electrode SG1 via the second sensing gate line SGL2, the Fermi energy level $E_f$ approaches an energy level of the conductive band $E_c$.

When the second sensing signal is applied to the first sensing gate electrode SG1, holes generated from the doped amorphous layer 264 is substantially easily drifted to the first and second amorphous layers 262 and 266 having higher electron potential than the doped amorphous layer 264, the holes are thereby accumulated in the first and second amorphous layers 262 and 266. Electrons of the first and second amorphous layers 262 and 266 are drifted to the doped amorphous layer 264 having a lower electron potential than the first and second amorphous layers 262 and 266 at the same time. The electrons of the first and second amorphous layers 262 and 266 are substantially easily moved to an inside of the second active pattern AP2, e.g., to the doped amorphous layer 264, by the second sensing gate signal. The electrons drifted to the doped amorphous layer 264 are confined in the electron well formed by the first and second amorphous layers 262 and 266 and the doped amorphous layer 264, and the electrons are thereby accumulated in the electron well. Thus, an electron density of the doped amorphous layer 264 is substantially higher than electron densities of other layers of the second active pattern AP2.

The second sensing gate signal forms a depletion area in the first and second amorphous layers 262 and 266 adjacent to the barriers "A" and "B." An energy band of the depletion area has a curvature shape decreasing from the barriers "A" and "B" to the inside of the second active pattern AP2.

When the second sensing gate signal is applied and the infrared light IR is irradiated to the first sensing element STR1, the second active pattern AP2 absorbs the infrared light IR. When the second active pattern AP2 absorbs the infrared light IR, the electrons accumulated in the electron well of the valence band $E_v$ are drifted to the conductive band $E_c$ to which the Fermi energy level $E_f$ approaches by the second sensing gate signal. The photo current may be increased due to the drift of the electrons compared to the second active pattern AP2 without the doped amorphous layer 264. In addition, when the infrared light IR is irradiated, the holes accumulated in the first and second amorphous layers 262 and 266 are substantially easily excited to the conductive band $E_c$, and a hole current thereby increases.

In an exemplary embodiment, the second active pattern AP2 including the first amorphous layer 262, the doped amorphous layer 264 and the second amorphous layer 266 effectively prevents a dark current from increasing when the infrared light IR is not irradiated, and generated substantially increased photo current when the infrared light IR is irradiated. Thus, the difference between the photo current and the dark current is substantially increased, and the sensitivity of the first sensing element STR1 for the infrared light IR is thereby substantially enhanced.

Hereinafter, an exemplary embodiment of a method of manufacturing a touch screen substrate 200 will be described in further detail with reference to FIGS. 7A to 7G.

FIGS. 7A to 7G are partial cross-sectional views of an exemplary embodiment of a method of manufacturing a touch screen substrate according to the present invention. For purposes of description herein, an exemplary embodiment of a method of manufacturing the touch screen substrate shown in FIG. 4A will be described, but it will be noted that additional exemplary embodiments are not limited thereto.

Figure 7A:
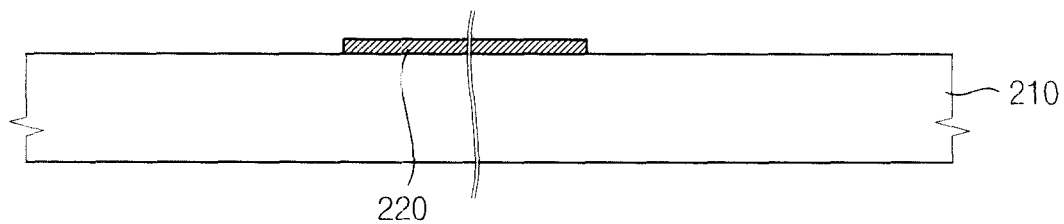
FIGS. 7A to 7G are partial cross-sectional views illustrating an exemplary embodiment of a method of manufacturing a touch screen substrate according to the present invention.

Referring to FIG. 7A, the light blocking pattern 220 is formed on the second base substrate 210. The light blocking pattern 220 may be formed by patterning after forming the semiconductor layer including amorphous silicon germanium ("a-SiGe") on the second base substrate 210.

Figure 7B:
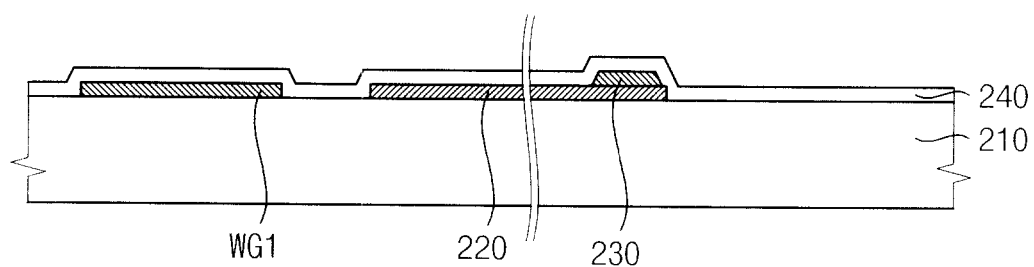

Referring to FIG. 7B, a first metal pattern including the first switching gate electrode WG1 and the contact electrode 230 is formed on the second base substrate 210 including the light blocking pattern 220 formed thereon. The first metal pattern may be formed by patterning after forming a first metal layer on the second base substrate 210. The contact electrode 230 is formed on the light blocking pattern 220. The first metal pattern may further include the first sensing gate line SGL1, the third sensing gate line SGL3 and the second switching gate electrode WG2.

The first insulating layer 240 is formed on the second base substrate 210 including the light blocking pattern 220 and the first metal pattern formed thereon.

Figure 7C:
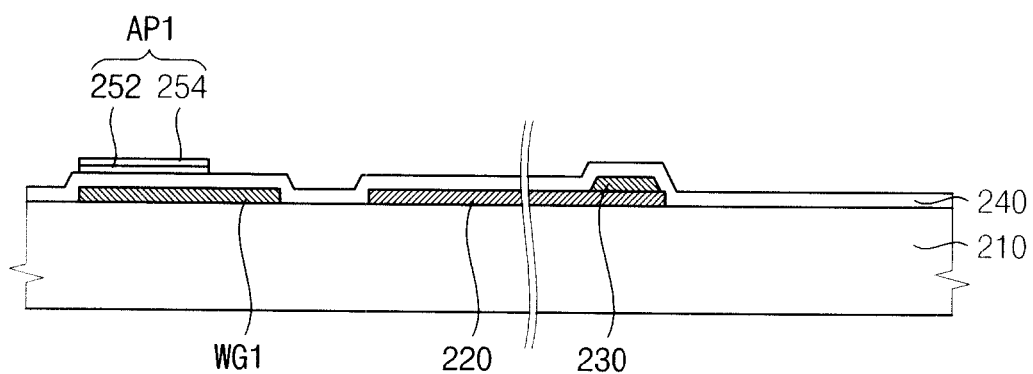

Referring to FIG. 7C, the first active pattern AP1 is formed on the second base substrate 210 including the first insulating layer 240 formed thereon. The first active pattern AP1 is formed on the second base substrate 210 including the first insulating layer 240 formed thereon by patterning after forming the semiconductor layer 252 and the first ohmic contact layer 254 on the second base substrate 210. The first active pattern AP1 is formed on the first switching gate electrode WG1. Although not shown in the figures, the third and fourth active patterns AP3 and AP4 may be formed on the second substrate by patterning the semiconductor layer 252 and the first ohmic contact layer 254 formed on the second base substrate 210.

Figure 7D:
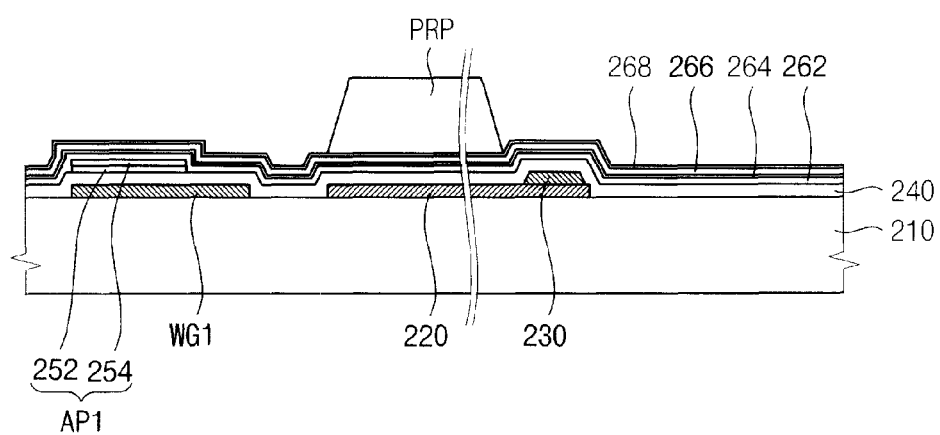

Referring to FIG. 7D, the first amorphous layer 262, the doped amorphous layer 264, the second amorphous layer 266 and the second ohmic contact layer are sequentially formed on the second base substrate 210 including the first, third and fourth active patterns AP1, AP3 and AP4 formed on the second base substrate 210. The doped amorphous layer 264 is formed by providing phosphine ($PH_3$) plasma to the second base substrate 210 while depositing amorphous silicon germanium on the second base substrate 210 including the first amorphous layer 262 formed thereon. A concentration of the phosphine plasma may be greater than about 0 at. % and not greater than about 5 at. % with respect to the total number of atoms of the doped amorphous layer 264, and the doped amorphous layer 264 having a thickness greater than about 0 Å and not greater than about 100 Å is thereby formed on the first amorphous layer 262 having a thickness of about 3000 Å. The second amorphous layer 266 is formed on the second base substrate 210 including the doped amorphous layer 264 formed thereon, and the second ohmic contact layer 268 is formed on the second amorphous layer 266. The second ohmic contact layer 268 may include amorphous silicon germanium doped with a high concentration of n-type impurities ("n+ a-SiGe"). The concentration of the impurities included the second ohmic contact layer 268 is about 5 times to about 50 times higher than the concentration of the impurities included in the doped amorphous layer 264.

A photoresist pattern PRP is formed on the second ohmic contact layer 268.

Figure 7E:
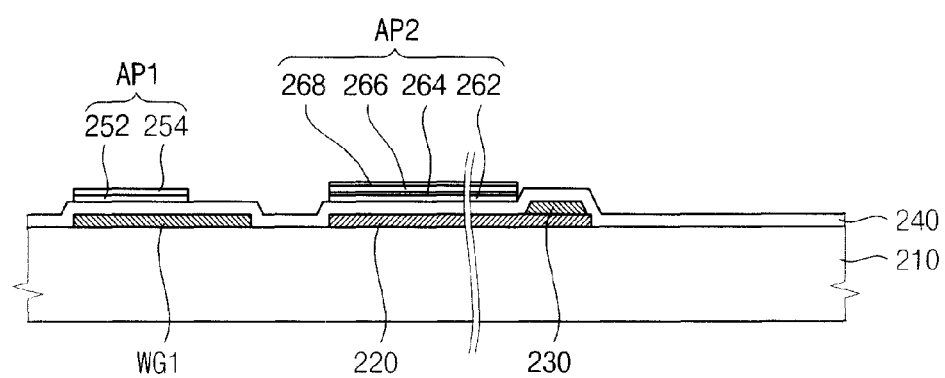

Referring to FIG. 7E, the first amorphous layer 262, the doped amorphous layer 264, the second amorphous layer 266 and the second ohmic contact layer 268 may be patterned using the photoresist pattern PRP serving as an etching stopper layer, and the second active pattern AP2 is thereby formed on the first insulating layer 240.

Although not shown in the figures, a protecting metal pattern may be formed on the second base substrate 210 including the first, third and fourth active patterns AP1, AP3 and AP4 formed thereon before forming the first amorphous layer 262, the doped amorphous layer 264, the second amorphous layer 266 and the second ohmic contact layer 268. The protecting metal pattern is formed on the first, third and fourth active patterns AP1, AP3 and AP4. The protecting metal pattern effectively prevents damages on the first, third and fourth active patterns AP1, AP3 and AP4 while forming the second active pattern AP2. The protecting metal pattern is removed after forming the second active pattern AP2.

Figure 7F:
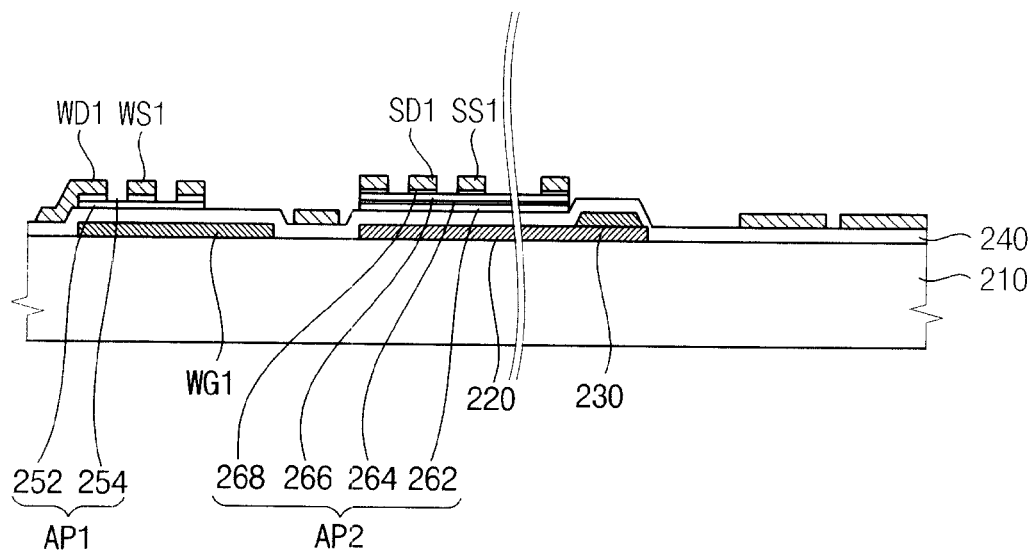

Referring to FIG. 7F, a second metal pattern, including the first switching source and drain electrodes WS1 and WD1 and the first sensing source and drain electrodes SS1 and SD1, is formed on the second base substrate 210 including the second active pattern AP2 formed thereon. The second metal pattern may be formed by patterning after forming a second metal layer on the second base substrate 210 including the second active pattern AP2 formed thereon. The second metal pattern may further include the first and second read-out lines R/O1 and R/O2, the second switching source and drain electrodes WS1 and WD2, and the second sensing source and drain electrodes SS2 and SD2.

A portion of the first ohmic contact layer 254 exposed through a space between the first switching source and drain electrodes WS1 and WD1, and a portion of the second ohmic contact layer 268 exposed through a space between the first sensing source and drain electrodes SS1 and SD1 are removed using the second metal pattern as a mask, and the semiconductor layer 252 and the second amorphous layer 266 are thereby exposed through the space between the first switching source and drain electrodes WS1 and WD1 and the space between the first sensing source and drain electrodes SS1 and SD1, respectively.

Figure 7G:
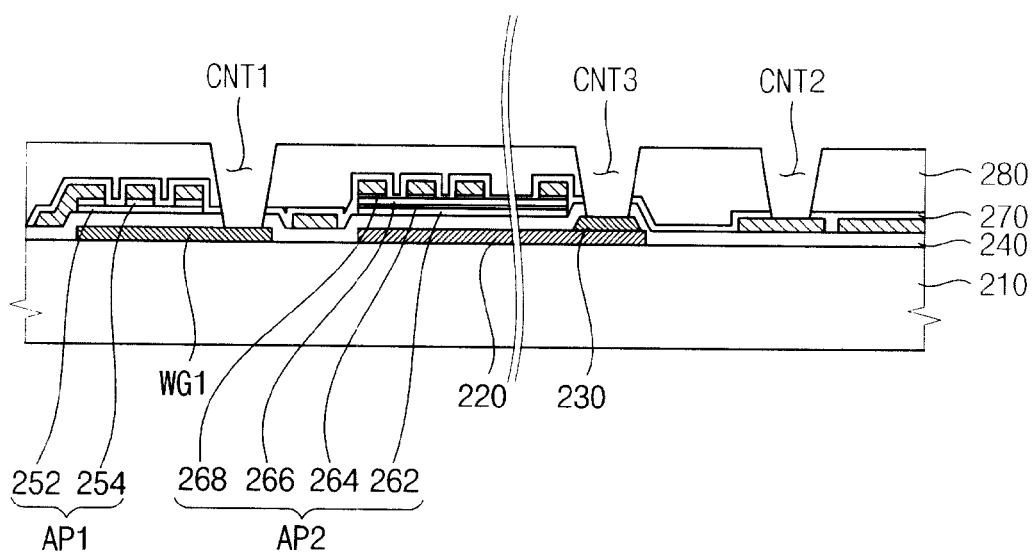

Referring now to FIGS. 7G and 4A, the second and third insulating layers 270 and 280, respectively, are formed on the second base substrate 210 including the second metal pattern formed thereon. The first contact hole CNT1 is formed by removing portions of the first, second and third insulating layers 240, 270 and 280, respectively, that overlap a portion of the first switching gate electrode WG1. The third contact hole CNT3 is formed by removing portions of the first, second and third insulating layers 240, 270 and 280 that overlap a portion of the contact electrode 230. The second contact hole CNT2 is formed by removing portions of the second and third insulating layers 270 and 280, respectively, that overlap a portion of the first sensing source electrode SS1.

A third metal layer is formed on the second base substrate 210 including the first, second and third contact holes CNT1, CNT2 and CNT3, by patterning after forming a third metal pattern on the second base substrate 210 including the first, second and third contact holes CNT1, CNT2 and CNT3. The third metal pattern includes the first and second top gate electrodes TG1 and TG2, the first and second sensing gate electrodes SG1 and SG2, the bias line VL and the second sensing gate line SGL2.

The black matrix BM, the color filter CF, the overcoating layer OC and the common electrode CE are formed on the second base substrate 210 including the third metal pattern formed thereon, and an exemplary embodiment of the touch screen substrate 200 is thereby manufactured.

Thus, according to exemplary embodiments described herein, the dark current is effectively prevented from increasing by using the second active pattern AP2, the photo current is substantially increased when the infrared light is irradiated onto the second active pattern AP2, and the sensitivity of the first sensing element STR1 for the infrared light is thereby substantially enhanced.

Figure 8:
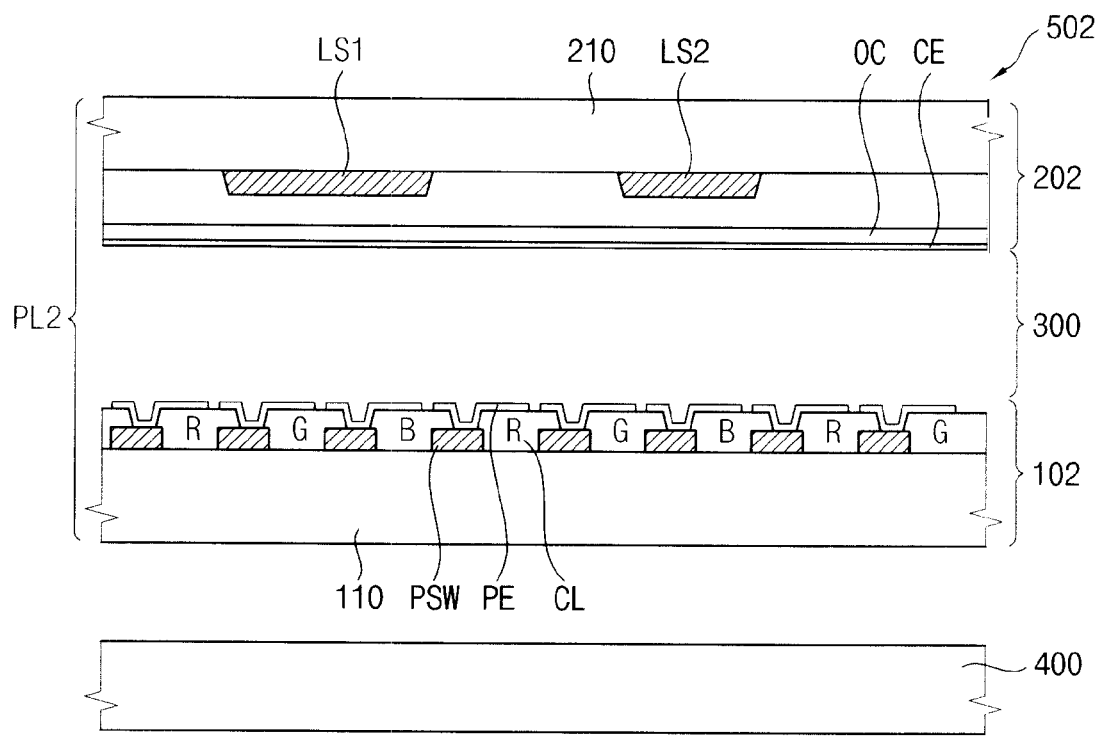
FIG. 8 is a partial cross-sectional view of another exemplary embodiment of a display panel according to the present invention.

FIG. 8 is a partial cross-sectional view of another exemplary embodiment of a display panel according to the present invention.

Referring to FIG. 8, an exemplary embodiment of a display device 502 includes a display panel PL2 and a backlight assembly 400 for providing light to the display panel PL2. The display panel PL2 includes an array substrate 102, a touch screen substrate 202 and a liquid crystal layer 300. The display device 502 shown in FIG. 8 is substantially the same as the display device 500 shown in FIGS. 1 to 3 except for the array substrate 102 and the touch screen substrate 202. The same or like elements shown in FIG. 1 have been labeled with the same reference characters as used above to describe the exemplary embodiment of the display panel shown in FIG. 8, and any repetitive detailed description thereof will hereinafter be omitted or simplified.

The array substrate 102 includes a pixel switching element PSW, a pixel electrode PE connected to the pixel switching element PSW and a color layer CL. The pixel switching element PSW, the pixel electrode PE and the color layer CL are disposed on the first base substrate 110.

The touch screen substrate 202 is disposed opposite to, e.g., facing, the array substrate 102. The touch screen substrate 202 is disposed on a second base substrate 210. The touch screen substrate 202 includes a first photo sensor LS1, a second photo sensor LS2, an overcoating layer OC and a common electrode CE.

Figure 9:
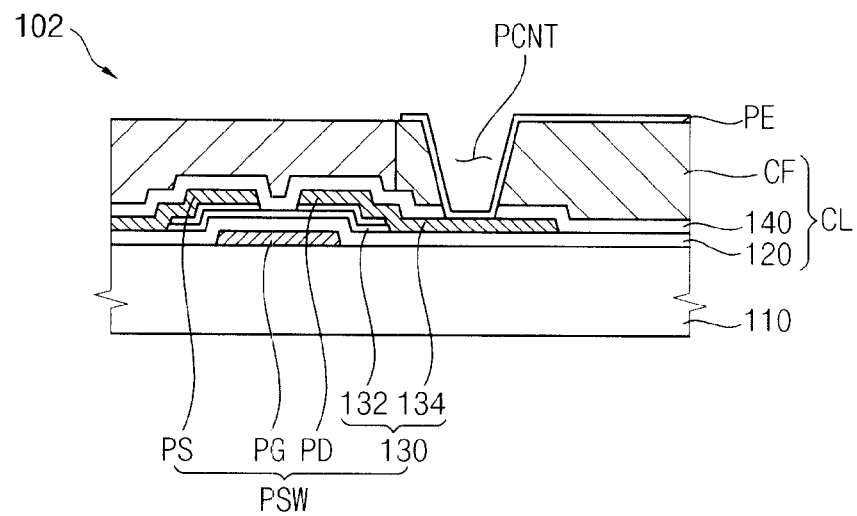
FIG. 9 is an enlarged partial cross-sectional view of an array substrate of the display panel shown in FIG. 8.

FIG. 9 is an enlarged partial cross-sectional view of the array substrate shown in FIG. 8.

The pixel switching element PSW and the pixel electrode PE shown in FIG. 9 are substantially the same as the pixel switching element PSW and the pixel electrode PE shown in FIG. 2. Thus, any further repetitive description thereof will hereinafter be omitted.

The color layer CL includes a gate insulating layer 120, a passivation layer 140 and a color filter CF. The color filter CF is disposed below the pixel electrode PE. The color layer CL may further include a black matrix BM. The black matrix BM may be disposed on the pixel switching element PSW and signal lines connected to the pixel switching element PSW.

Figure 10A:
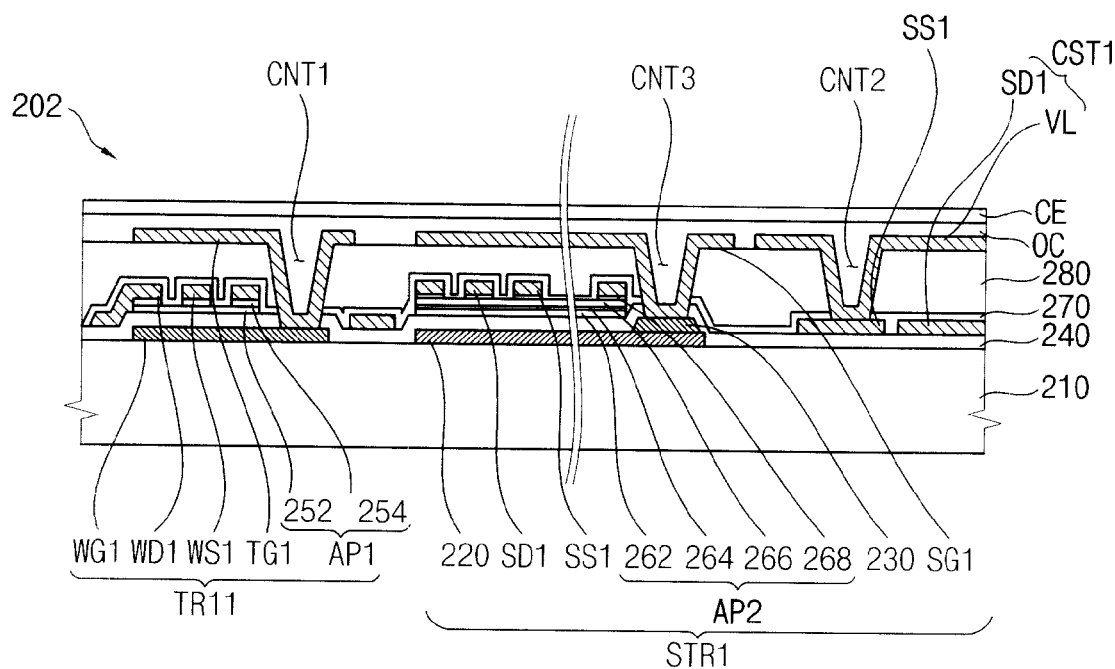
FIGS. 10A and 10B are partial cross-sectional views of a touch screen substrate of the display panel shown in FIG. 8.
Figure 10B:
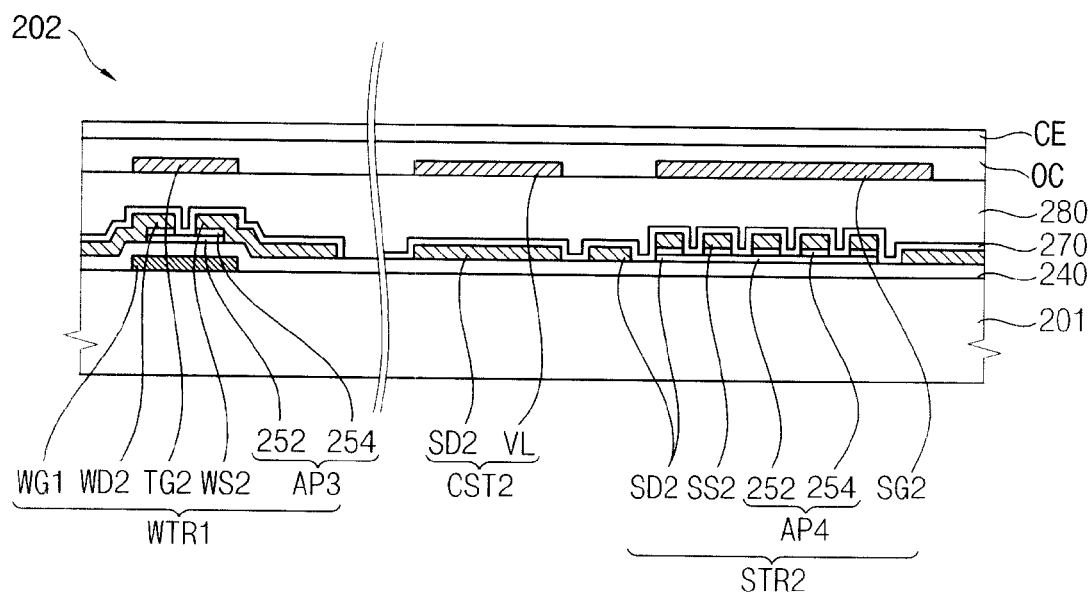

FIGS. 10A and 10B are partial cross-sectional views of a touch screen substrate of the display panel shown in FIG. 8.

Referring to FIGS. 10A and 10B, the touch screen substrate 202 includes a first switching element WTR1 including a first active pattern AP1, a first sensing element STR1 including a second active pattern AP2, a second switching element WTR2 including a third active pattern AP3, a second sensing element STR2 including a fourth active pattern AP4, the overcoating layer OC and the common electrode CE.

The touch screen substrate 202 shown in FIGS. 10A and 10B is substantially the same as the touch screen substrate 200 shown in FIGS. 4A and 4B except that the overcoating layer OC and the common electrode CE are disposed on a first top gate electrode TG1 of the first switching element WTR1, a first sensing gate electrode SG1 of the first sensing element STR1, a second top gate electrode TG2 of the second switching element WTR2 and a second sensing gate electrode SG2 of the second sensing element STR2. Thus, any further repetitive description thereof will hereinafter be omitted.

Processes of forming the first and second switching elements WTR1 and WTR2 and the first and second sensing elements STR1 and STR2 of the touch screen substrate 202 shown in FIGS. 10A and 10B are substantially the same as process of forming the first and second switching elements WTR1 and WTR2 and the first and second sensing elements STR1 and STR2 in the method of manufacturing the touch screen substrate shown in FIGS. 7A to 7E. Thus, any further repetitive description thereof will hereinafter be omitted.

In an exemplary embodiment, the touch screen substrate 202 may be manufactured by forming the overcoating layer OC and the common electrode CE on the second base substrate 210 including the first and second switching elements WTR1 and WTR2 and the first and second sensing elements STR1 and STR2.

According to exemplary embodiments of the present invention, the second active pattern AP2 effectively prevents a dark current from increasing, substantially increases photo current when the infrared light is irradiated, and the sensitivity of the first sensing element for the infrared light is thereby enhanced.

According to exemplary embodiments of the present invention, the first sensing element having the enhanced sensitivity to the infrared light may be used in a touch screen substrate and a display panel including the touch screen substrate.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A touch screen substrate comprising:
   a base substrate;
   a first switching element disposed on the base substrate, the first switching element comprising:
      a first switching gate electrode;
      a first active pattern disposed on the first switching gate electrode;
      a first switching source electrode disposed on the first active pattern; and
      a first switching drain electrode disposed apart from the first switching source electrode; and
   a first sensing element disposed on the base substrate and configured to sense infrared light reflected by an object on the base substrate, the first sensing element comprising:
      a first sensing drain electrode connected to the first switching source electrode;
      a first sensing source electrode disposed apart from the first sensing drain electrode;
      a second active pattern disposed below the first sensing drain electrode and the first sensing source electrode and including a first amorphous layer, a second amorphous layer vertically spaced apart from the first amorphous layer, and a doped amorphous layer interposed between the first amorphous layer and the second amorphous layer; and
      a first sensing gate electrode disposed on the first sensing drain electrode and the first sensing source electrode.

2. The touch screen substrate of claim 1, wherein the first amorphous layer and the second amorphous layer include one of amorphous silicon germanium and amorphous germanium.

3. The touch screen substrate of claim 1, wherein the doped amorphous layer includes one of amorphous silicon germanium doped with at least one selected from a group consisting of phosphorus, arsenic and antimony, and amorphous germanium doped with at least one selected from a group consisting of phosphorus, arsenic and antimony.

4. The touch screen substrate of claim 1, wherein the first active pattern comprises:
   a silicon layer including amorphous silicon; and
   an ohmic contact layer disposed on the silicon layer and doped with n-type impurities.

5. The touch screen substrate of claim 1, wherein a thickness of the doped amorphous layer is greater than zero angstroms and not greater than 100 angstroms.

6. The touch screen substrate of claim 1, further comprising a light blocking pattern disposed below the first sensing element and connected to the first sensing gate electrode.

7. The touch screen substrate of claim 1, further comprising:
   a first sensing gate line connected to the first switching gate electrode;
   a bias line connected to the first sensing source electrode;
   a first read-out line connected to the first switching drain electrode and which transmits an infrared light sensing signal generated from the first sensing element; and
   a second sensing gate line connected to the first sensing gate electrode.

8. The touch screen substrate of claim 7, further comprising:
   a second sensing element which senses visible light, the second sensing element comprising:
      a second sensing source electrode connected to the bias line;
      a second sensing drain electrode disposed apart from the second sensing source electrode;
      a third active pattern overlapping the second sensing source electrode and the second sensing drain electrode; and
      a second sensing gate electrode connected to the second sensing gate line; and
   a second switching element comprising:
      a second switching source electrode connected to the second sensing drain electrode;
      a second switching drain electrode disposed apart from the second switching source electrode;
      a fourth active pattern overlapping the second switching source electrode and the second switching drain electrode; and
      a switching gate electrode overlapping the fourth active pattern.

9. The touch screen substrate of claim 8, further comprising:
   a third sensing gate line connected to the second switching gate electrode; and
   a second read-out line connected to the second switching drain electrode and which transmits a visible light sensing signal generated from the second sensing element.

10. A display panel comprising:
   an array substrate including a pixel electrode and a pixel switching element connected to the pixel electrode; and
   a touch screen substrate disposed opposite the array substrate and including a switching element and a sensing element configured to sense infrared light reflected by an object on the touch screen substrate,
   wherein the switching element comprises:
      a switching gate electrode;
      a first active pattern disposed on the switching gate electrode;
      a switching source electrode disposed on the first active pattern; and
      a switching drain electrode disposed apart from the switching source electrode, and
   the sensing element comprises:
      a sensing drain electrode connected to the switching source electrode;
      a sensing source electrode disposed apart from the sensing drain electrode;

a second active pattern disposed below the sensing drain electrode and the sensing source electrode and including a first amorphous layer, a second amorphous layer spaced apart from the first amorphous layer, and a doped amorphous layer interposed between the first amorphous layer and the second amorphous layer; and a sensing gate electrode disposed on the sensing drain electrode and the sensing source electrode.

\* \* \* \* \*